(12) United States Patent
Ozeki et al.

(10) Patent No.: US 11,171,260 B2
(45) Date of Patent: Nov. 9, 2021

(54) LIGHT-EMITTING DEVICE AND METHOD FOR MANUFACTURING LIGHT-EMITTING DEVICE

(71) Applicant: NICHIA CORPORATION, Anan (JP)

(72) Inventors: Kenji Ozeki, Tokushima (JP); Atsushi Kojima, Tokushima (JP); Chinami Nakai, Anan (JP); Yoshio Ichihara, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/586,270

(22) Filed: Sep. 27, 2019

(65) Prior Publication Data

US 2020/0105974 A1    Apr. 2, 2020

(30) Foreign Application Priority Data

Sep. 28, 2018 (JP) .............................. JP2018-184186

(51) Int. Cl.
*H01L 33/44* (2010.01)
*H01L 33/56* (2010.01)
*H01L 33/60* (2010.01)
*H01L 33/54* (2010.01)

(52) U.S. Cl.
CPC .............. *H01L 33/44* (2013.01); *H01L 33/54* (2013.01); *H01L 33/56* (2013.01); *H01L 33/60* (2013.01)

(58) Field of Classification Search
CPC ......... H01L 33/60; H01L 33/56; H01L 33/44; H01L 33/54
See application file for complete search history.

(56) References Cited

U.S. PATENT DOCUMENTS

| 2003/0025450 | A1  | 2/2003  | Katayama et al. |
| 2004/0033361 | A1* | 2/2004  | Hamaguchi ........... C04B 35/524 428/408 |
| 2006/0170332 | A1* | 8/2006  | Tamaki .............. C09K 11/7728 313/498 |
| 2007/0228949 | A1* | 10/2007 | Maruyama ............. H05B 33/14 313/512 |
| 2011/0316025 | A1* | 12/2011 | Kuzuhara ............. H01L 33/504 257/98 |
| 2012/0161621 | A1  | 6/2012  | Sato |
| 2013/0169149 | A1* | 7/2013  | Sato ................... C09K 11/7774 313/512 |
| 2013/0307013 | A1  | 11/2013 | Chan et al. |

(Continued)

FOREIGN PATENT DOCUMENTS

| EP | 2 144 305 A1 | 1/2010 |
| JP | S56-26973 U  | 3/1981 |

(Continued)

*Primary Examiner* — Vongsavanh Sengdara
(74) *Attorney, Agent, or Firm* — Foley & Lardner LLP

(57) ABSTRACT

A light-emitting device includes: a mounting board; at least one light-emitting element located on or above the mounting board; a first covering member comprising, in order from an upper surface of the mounting board: a containing layer comprising a light-absorbing material, and a light-transmissive layer; and a second covering member over the first covering member and the light-emitting element. A thickness of the containing layer is less than a thickness of the light-emitting element.

15 Claims, 11 Drawing Sheets

(56) References Cited

U.S. PATENT DOCUMENTS

| | | | |
|---|---|---|---|
| 2014/0252389 A1* | 9/2014 | Koizumi | ............... H01L 33/501 |
| | | | 257/98 |
| 2016/0197249 A1 | 7/2016 | Sato et al. | |
| 2016/0300989 A1* | 10/2016 | Kawano | ................. H01L 24/85 |
| 2019/0035979 A1 | 1/2019 | Yokote et al. | |

FOREIGN PATENT DOCUMENTS

| | | | |
|---|---|---|---|
| JP | 2003-046138 A | 2/2003 | |
| JP | 2012-151466 A | 8/2012 | |
| JP | 2013-222887 A | 10/2013 | |
| JP | 2015-012203 A | 1/2015 | |
| JP | 2016-029686 A | 3/2016 | |
| JP | 2016-072412 A | 5/2016 | |
| JP | 2017-157593 A | 9/2017 | |
| WO | WO-2012/029695 A1 | 3/2012 | |

\* cited by examiner

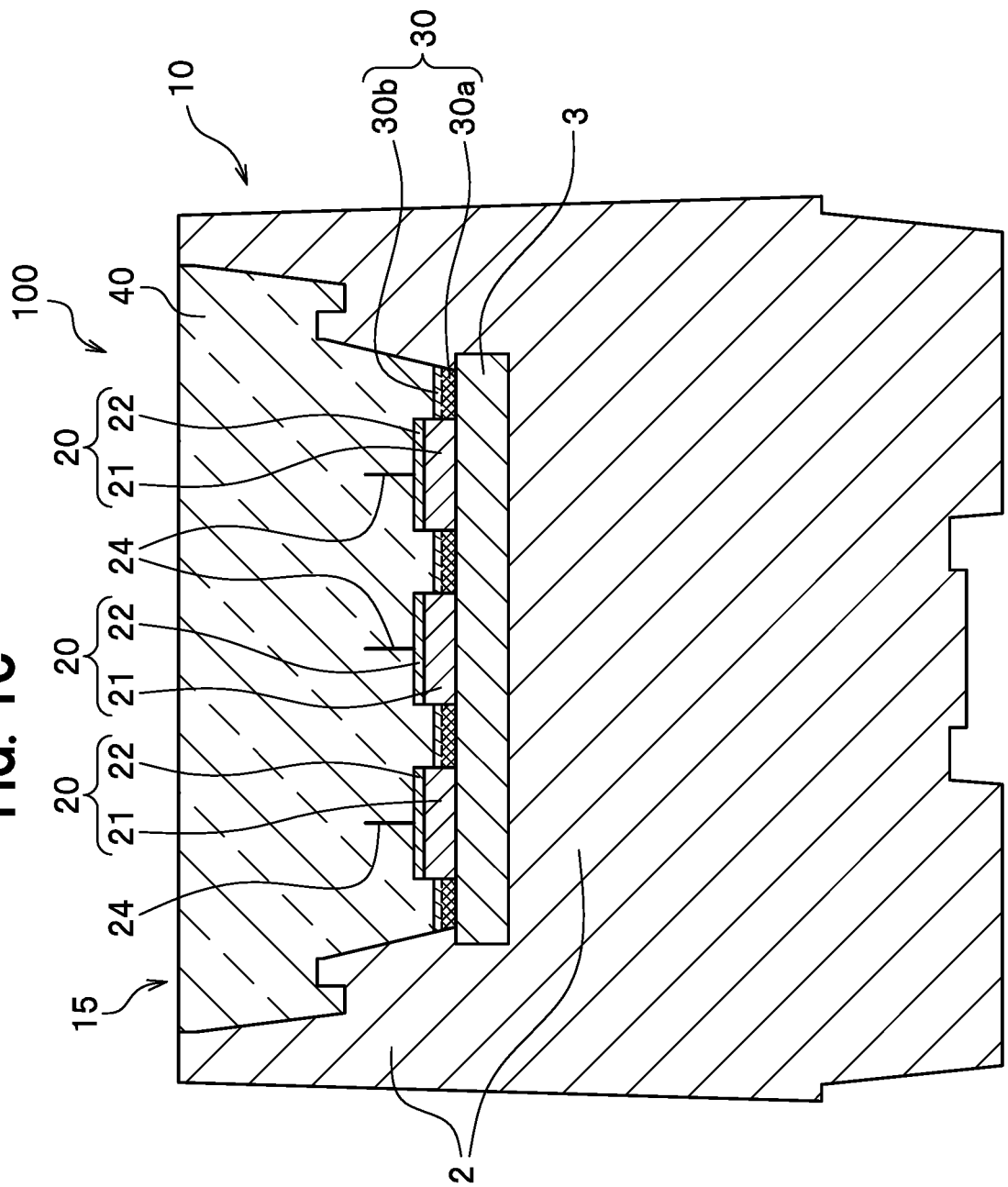

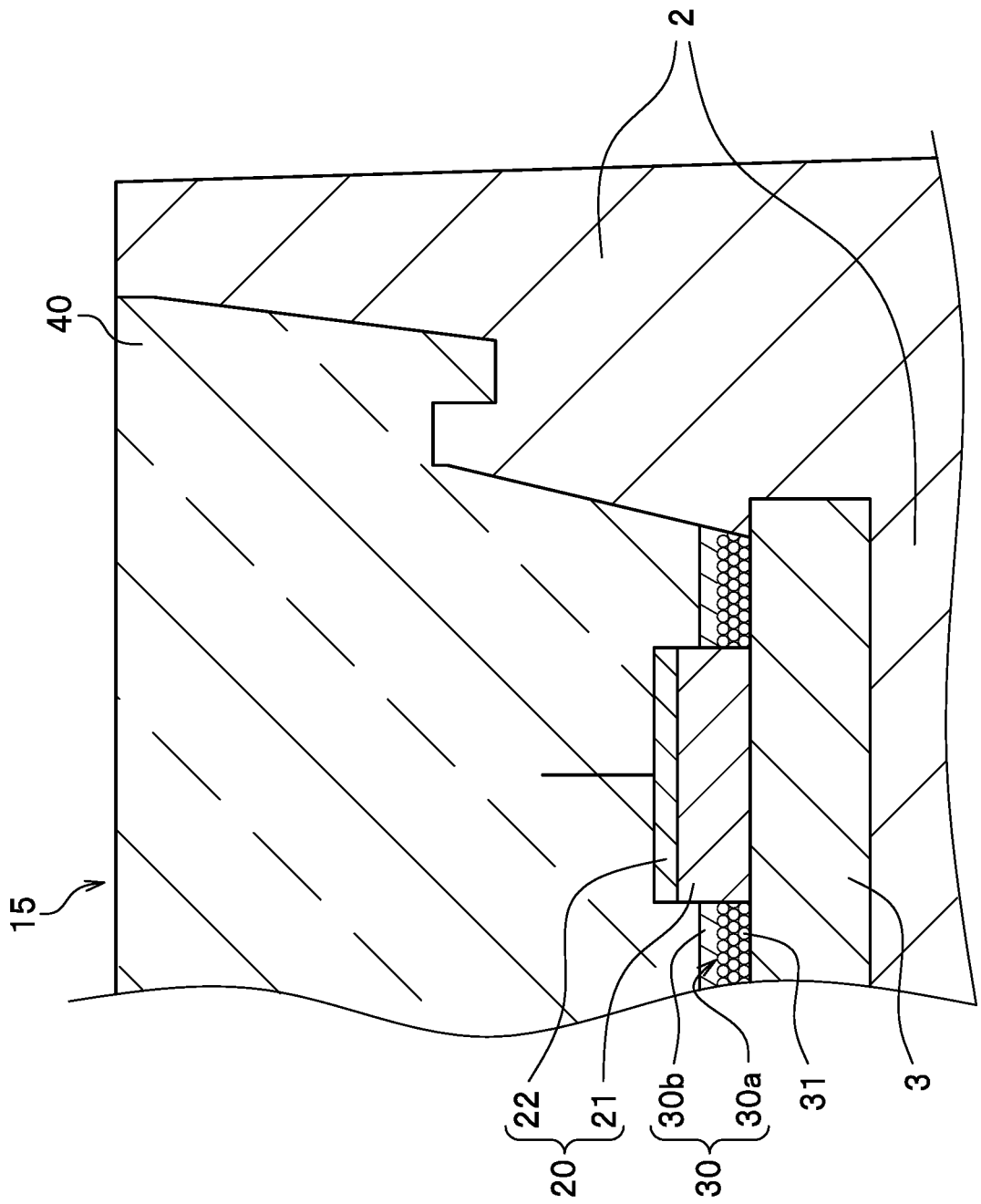

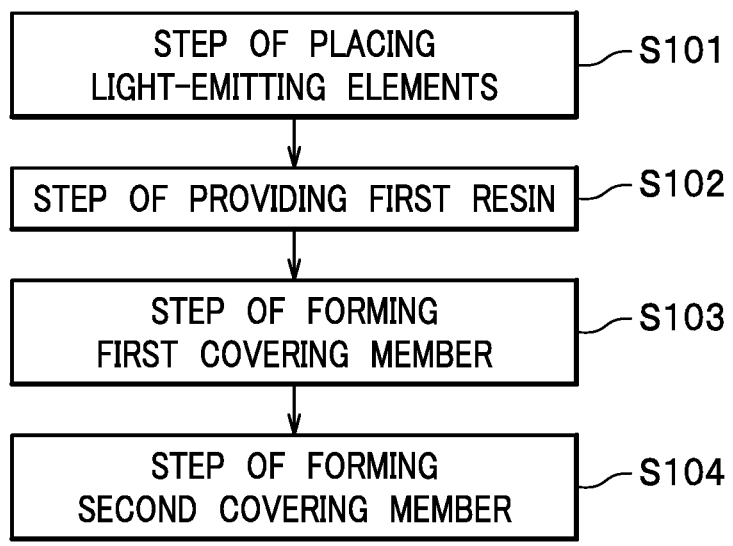

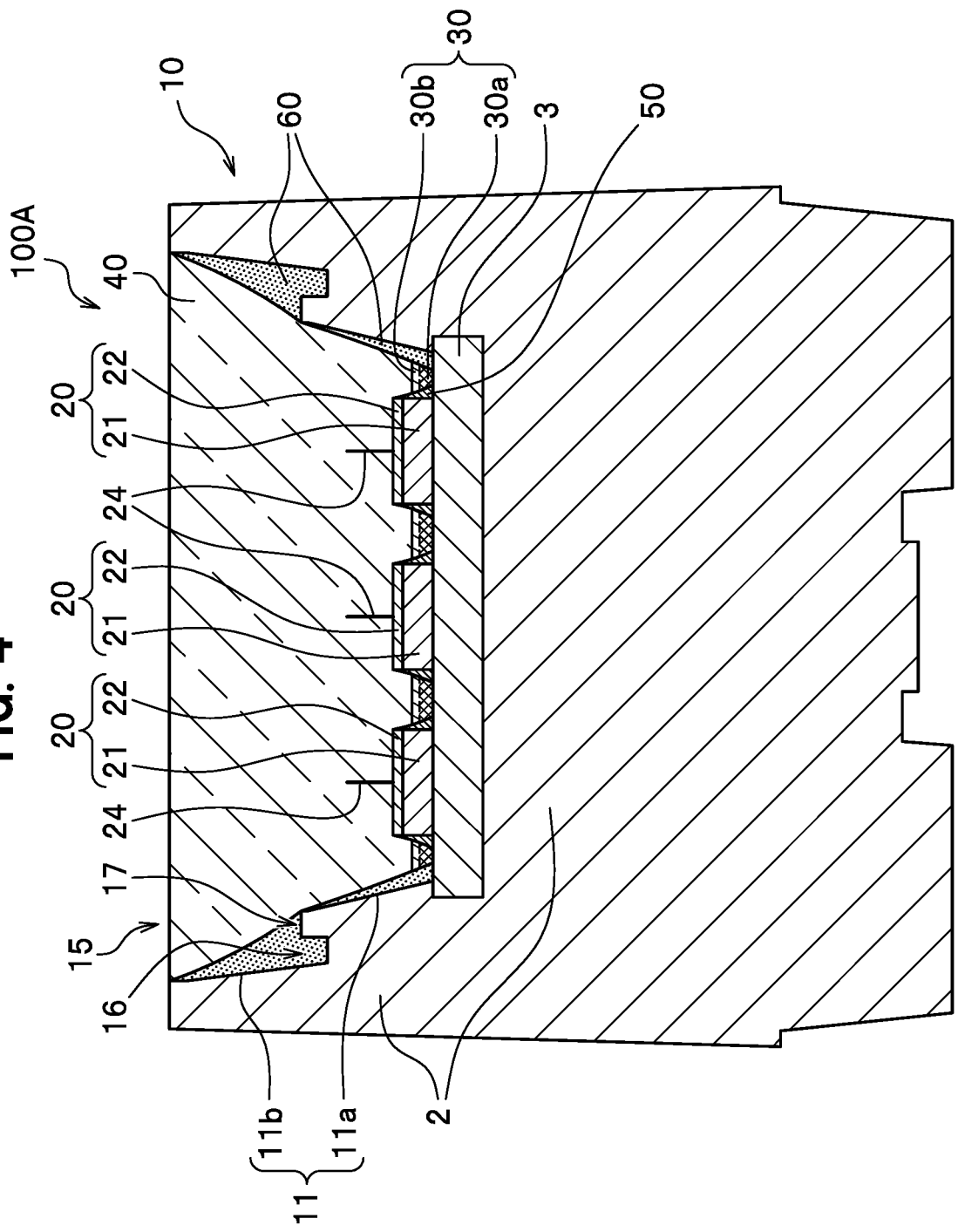

LIGHT-EMITTING DEVICE AND METHOD FOR MANUFACTURING LIGHT-EMITTING DEVICE

CROSS-REFERENCE TO RELATED APPLICATION

This application claims priority to Japanese Patent Application No. 2018-184186, filed on Sep. 28, 2018, the contents of which are hereby incorporated herein by reference in their entirety.

BACKGROUND

The present disclosure relates to a light-emitting device and a method for manufacturing the light-emitting device.

A light-emitting device including a light-absorbing layer on a light-emitting element mounting surface is conventionally known.

For example, Japanese Patent Publication No. 2003-46138 discloses an LED lamp that includes a black-colored light-absorbing layer disposed on an LED chip mounting surface and that is used for a display panel.

SUMMARY

A display represents a black color by turning off the light-emitting device constituting each pixel. Hence, a light-emitting device used for a display is required to have a black appearance in the unlit state. In the technology disclosed in the above patent literature, wiring members such as a lead frame are not covered with a light-absorbing layer, and there is a portion that is unlikely to look black when the LED lamp is unlit.

An object of an embodiment according to the present disclosure is to provide a light-emitting device that has a black appearance in the unlit state and a method for manufacturing the light-emitting device.

According to one embodiment, a light-emitting device includes a mounting board, at least one light-emitting element placed on or above the mounting board, a first covering member containing a light-absorbing material and including, in this order from an upper surface of the mounting board, a containing layer containing the light-absorbing material and a light-transmissive layer, and a second covering member over the first covering member and the light-emitting element, a thickness of the containing layer being smaller than a thickness of the light-emitting element.

According to another embodiment, a method for manufacturing a light-emitting device includes a step of placing at least one light-emitting element on or above a mounting board, a step of forming a first covering member by covering an upper surface of the mounting board with a first resin containing a light-absorbing material, and a step of forming a second covering member by covering the first covering member and the light-emitting element with a second resin, the first covering member being formed in the step of forming a first covering member such that a containing layer containing the light-absorbing material and a light-transmissive layer are formed in this order from the upper surface of the mounting board by sedimenting the light-absorbing material in the first resin using a centrifugal force and such that at least a portion of a lateral surface of the light-emitting element is exposed from the containing layer.

According to another embodiment, a method for manufacturing a light-emitting device includes a step of placing at least one light-emitting element on or above a mounting board, a step of forming a first covering member by covering an upper surface of the mounting board with a first resin containing a light-absorbing material, and a step of forming a second covering member by covering the first covering member and the light-emitting element with a second resin, the first resin being disposed on the mounting board by potting, deformed to cover the entire upper surface of the mounting board by being subjected to a centrifugal force applied to the mounting board about such a rotation axis that the upper surface of the mounting board is located outside, and cured under the centrifugal force in the step of forming a first covering member.

A light-emitting device of an embodiment according to the present disclosure has a black appearance in the unlit state.

A light-emitting device that has a black appearance in the unlit state can be manufactured by a method for manufacturing a light-emitting device of an embodiment according to the present disclosure.

BRIEF DESCRIPTION OF THE DRAWINGS

FIG. 1C is a schematic sectional view taken along the line IC-IC of FIG. 1A.

FIG. 1D is a schematic sectional view illustrating a portion of the structure of the light-emitting device according to the embodiment.

FIG. 2 is a flowchart illustrating a method for manufacturing the light-emitting device according to the embodiment.

FIG. 4 is a schematic sectional view illustrating the structure of a light-emitting device according to another embodiment.

DETAILED DESCRIPTION

Figure 1A:
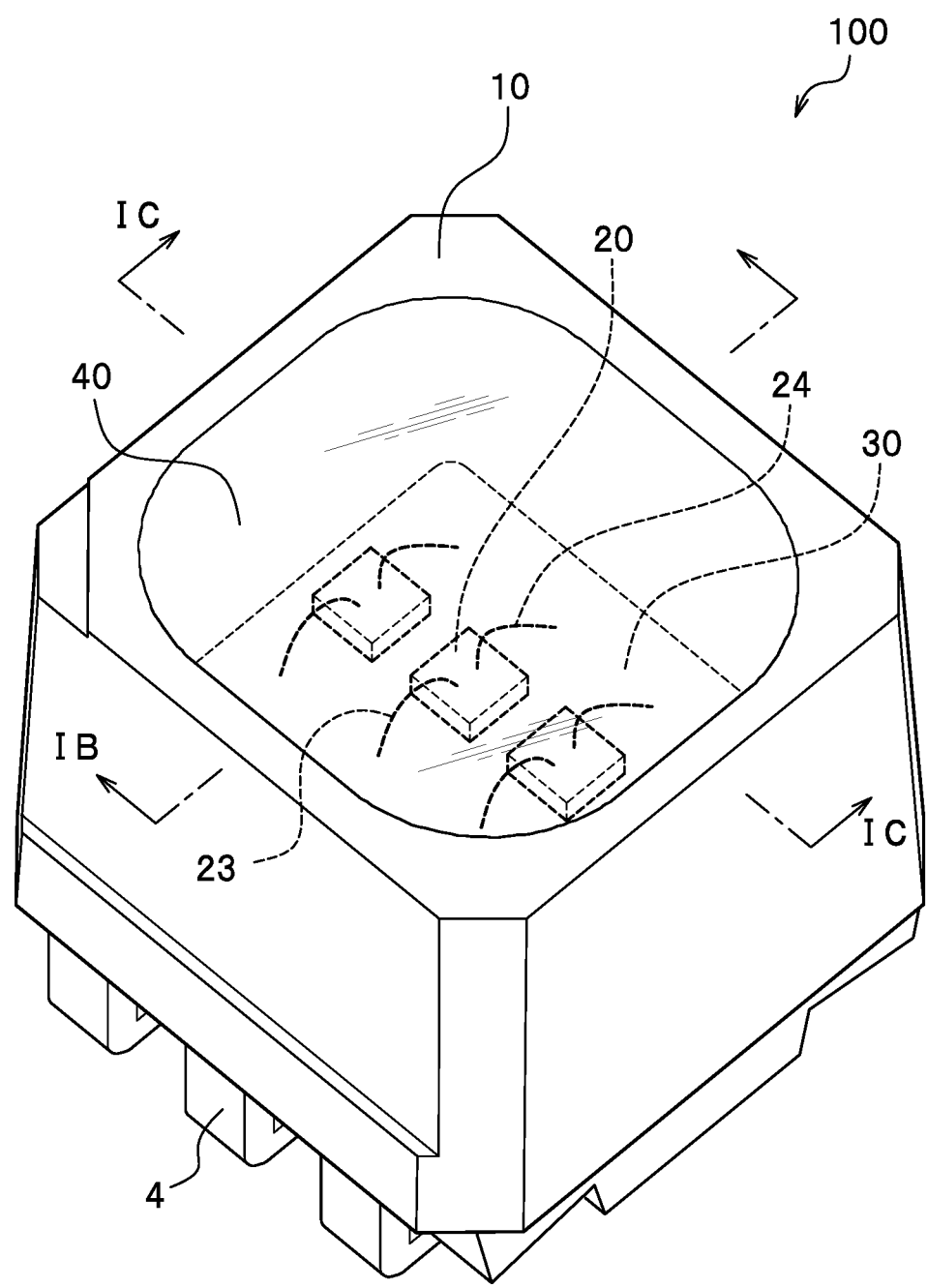
FIG. 1A is a schematic perspective view illustrating the structure of a light-emitting device according to an embodiment.

Embodiments of the present disclosure are described below with reference to the drawings. The embodiments described below exemplify light-emitting devices and methods for manufacturing light-emitting devices embodying the technical concepts of the present disclosure. However, the invention is not limited to the embodiments described below. Unless specifically stated otherwise, descriptions of the sizes, materials, shapes, and relative positions of constituent components in the embodiments described below are not intended to limit the scope of the present invention to those descriptions, but are rather only examples. Magnitudes or positional relationships of members illustrated in the drawings may be exaggerated in order to clarify the descriptions.

Embodiment

Figure 1B:
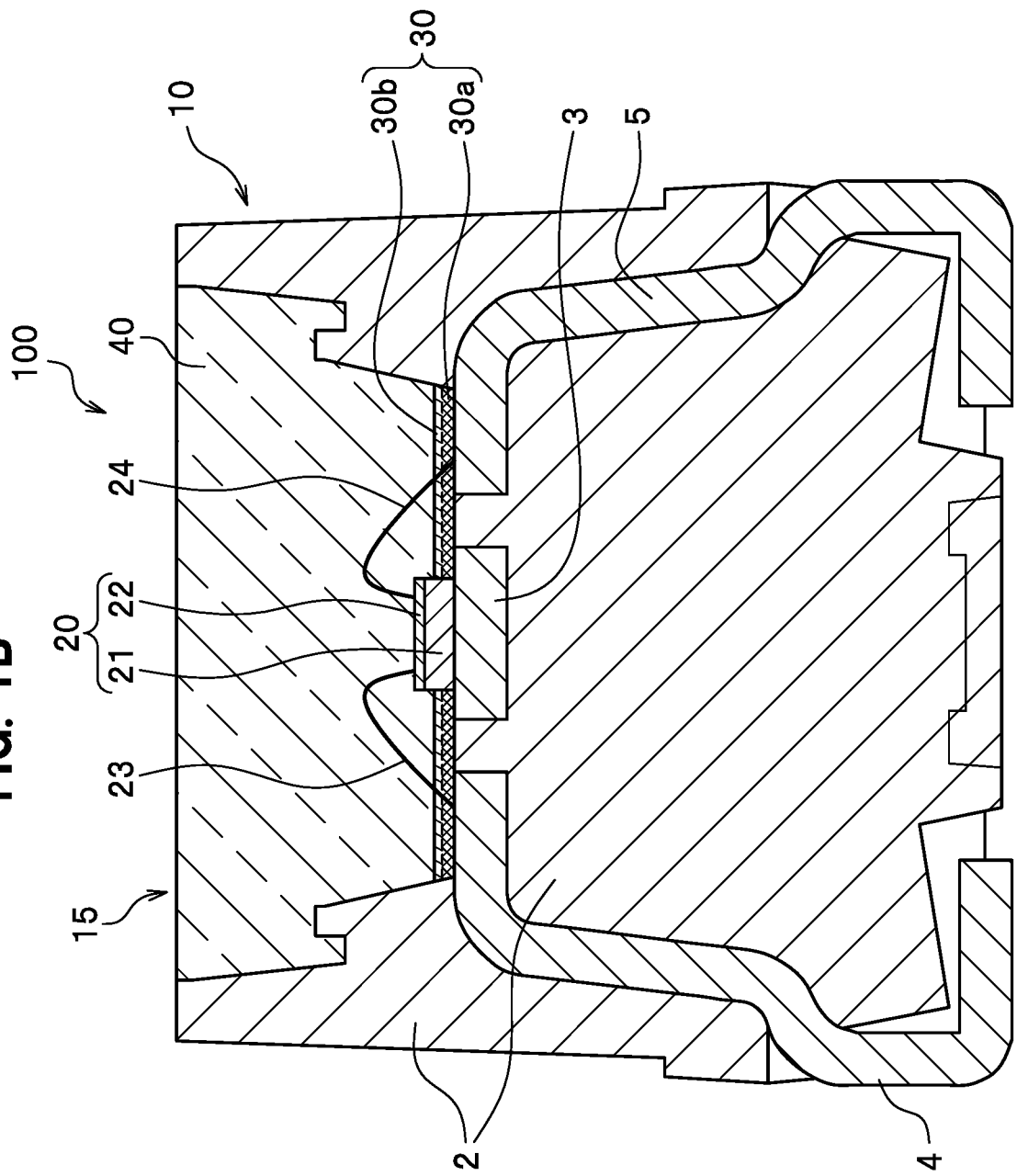
FIG. 1B is a schematic sectional view taken along the line IB-IB of FIG. 1A.

FIG. 1A is a schematic perspective view illustrating the structure of a light-emitting device according to an embodiment. FIG. 1B is a schematic sectional view taken along the line IB-IB of FIG. 1A. FIG. 1C is a schematic sectional view taken along the line IC-IC of FIG. 1A. FIG. 1D is a schematic sectional view illustrating a portion of the structure of the light-emitting device according to the embodiment.

[Light-Emitting Device]

A light-emitting device 100 includes a mounting board 10, light-emitting elements 20 placed on or above the mounting board 10, a first covering member 30 containing a light-absorbing material 31 and covering the upper surface of the mounting board 10, and a second covering member 40 disposed over the first covering member 30 and the light-emitting elements 20.

The first covering member 30 includes a containing layer 30a containing the light-absorbing material 31 and a light-transmissive layer 30b. The containing layer 30a and the light-transmissive layer 30b are disposed in this order from the upper surface of the mounting board.

The mounting board 10 includes an insulating member 2, a first wiring portion 3, a second wiring portion 4, and a third wiring portion 5. The mounting board 10 has a recessed portion 15 on its upper surface for accommodating the light-emitting elements 20. The opening of the recessed portion 15 has, for example, a substantially rectangular shape having curved corners in a plan view.

The recessed portion 15 is defined by a bottom surface on or above which the light-emitting elements 20 are placed and wall surfaces surrounding the bottom surface. The light-emitting elements 20 are placed on or above the first wiring portion 3 exposed on the bottom surface of the recessed portion 15.

For example, a thermoplastic resin, such as polyamides (PA), polyphthalamides (PPA), poly(phenylene sulfides) (PPS), and liquid crystal polymers, or a thermosetting resin, such as epoxy resins, silicone resins, modified epoxy resins, urethane resins, and phenolic resins, can be used for the insulating member 2. A glass epoxy resin, a ceramic, or glass is more preferably used for the insulating member 2. In the case in which a ceramic is used for the insulating member 2, alumina, aluminum nitride, mullite, silicon carbide, or silicon nitride is particularly preferably used. The insulating member 2 is preferably black in color so as to make the appearance blacker in the unlit state of the light-emitting device 100.

The first wiring portion 3 is exposed at the bottom surface of the recessed portion 15 and is connected to the light-emitting elements 20. One end of each of the second wiring portion 4 and the third wiring portion 5 is exposed at the bottom surface of the recessed portion 15, the second wiring portion 4 and the third wiring portion 5 extend through the insulating member 2, and the other end of each of the second wiring portion 4 and the third wiring portion 5 is disposed on the lower surface of the insulating member 2 and serves as an external electrode of the light-emitting device 100 electrically connected to an external power supply.

For example, Fe, Cu, Ni, Al, Ag, Au, or an alloy containing one of these metals can be used for the first wiring portion 3, the second wiring portion 4, and the third wiring portion 5.

Plating layers may be formed on the surfaces of the first wiring portion 3, the second wiring portion 4, and the third wiring portion 5. For example, Au, Ag, Cu, Pt, or an alloy containing one of these metals can be used for the plating layers. If the plating layers are made of any of these materials, the reflectance of light emitted from the light-emitting elements 20 toward the wiring portions can be further enhanced.

Each of the light-emitting elements 20 includes a light-transmissive support substrate 21 and a semiconductor layer 22 formed on the support substrate 21. An electrically-conductive substrate as well as an insulating substrate can be used as the support substrate 21. Any shape, size, and the like of the light-emitting element 20 can be selected. Any appropriate wavelength can be selected as the emission wavelength of the light-emitting element 20 depending on the purpose. Examples of a blue (light with wavelengths in a range of 430 nm to 490 nm) or green (light with wavelengths in a range of 495 nm to 565 nm) light-emitting element 20 include a light-emitting element including a nitride semiconductor ($In_XAl_YGa_{1-X-Y}N$, where $0 \leq X$, $0 \leq Y$, and $X+Y \leq 1$) or GaP. For a red (light with wavelengths in a range of 610 nm to 700 nm) light-emitting element 20, GaAlAs, AlInGaP, or the like can be used besides a nitride semiconductor element.

The thickness of the light-emitting element 20 (such as the height from the lower surface of the support substrate 21 to the upper surface of the semiconductor layer 22) is, for example, in a range of 100 μm to 300 μm.

The light-emitting element 20 includes a pair of electrodes on its upper surface and is face-up mounted on or above the bottom surface of the recessed portion 15 of the mounting board 10. The light-emitting element 20 is placed on or above the first wiring portion 3. In this case, one of the electrodes of the light-emitting element 20 is bonded to the second wiring portion 4 with an electrically-conductive member such as a wire 23, and the other electrode is bonded to the third wiring portion 5 with an electrically-conductive member such as a wire 24.

By face-up mounting the light-emitting element 20, the semiconductor layer 22 of the light-emitting element 20 is disposed facing the upper surface (in other words, the light extracting surface of the light-emitting device 100). This can inhibit the semiconductor layer 22 from facing the containing layer 30a.

This structure reduces losses of primary light due to absorption of light emitted from the lateral surfaces of the light-emitting element 20 into the first covering member. The light distribution characteristics of the light-emitting device 100 can be further improved because of increase in the primary light to be extracted from the lateral surfaces of the light-emitting element 20.

The light-emitting device 100 includes a plurality of light-emitting elements 20. In this case, three light-emitting elements (a blue light-emitting element, a green light-emitting element, and a red light-emitting element) 20 are disposed on or above the mounting board 10. However, the light-emitting device may include one, two, or four or more light-emitting elements 20.

The first covering member 30 is made of a first resin containing the light-absorbing material 31 and covers the bottom surface of the recessed portion 15 of the mounting board 10. In this case, the first covering member 30 includes the containing layer 30a containing the light-absorbing material 31 and the light-transmissive layer 30b in this order from the bottom surface of the recessed portion 15. The first covering member 30 covers the upper surface of the insulating member 2 and the upper surfaces of the first wiring portion 3, the second wiring portion 4, and the third wiring portion 5 on the bottom surface of the recessed portion 15. The first covering member 30 having a substantially uniform thickness covers the bottom surface of the recessed portion 15.

As the first covering member 30 containing the light-absorbing material 31 covers the bottom surface of the recessed portion 15, the light-emitting device 100 has a black appearance in the unlit state of the light-emitting device 100.

The first covering member 30 is disposed such that the thickness of the containing layer 30a is smaller than the thickness of the light-emitting element 20. That is, the first covering member 30 is disposed such that at least a portion of the lateral surfaces of the light-emitting element 20 does not face the containing layer 30a. In this case, only a portion of the lateral surfaces of the light-emitting element 20 at the mounting surface (in other words, a portion at the bottom surface of the recessed portion 15) is covered with the first covering member 30. The other portion of the lateral surfaces is exposed from the first covering member 30 and covered with the second covering member 40. In the case in which the light-emitting device 100 includes a plurality of light-emitting elements 20, the first covering member 30 is disposed such that the thickness of the containing layer 30a is smaller than the thicknesses of all the light-emitting elements 20 of the light-emitting device 100.

The lateral surfaces of each light-emitting element 20 here are portions including the lateral surfaces of the support substrate 21 and the lateral surfaces of the semiconductor layer 22.

The first covering member 30 is disposed such that at least the thickness of the containing layer 30a is smaller than the thickness of the light-emitting element 20. The first covering member 30 is further preferably disposed such that the thickness of the first covering member 30 is smaller than the thickness of the light-emitting element 20. This structure enhances the light extraction efficiency from the lateral surfaces of the light-emitting element 20 and improves the light distribution characteristics in the area beside the light-emitting element 20.

In a sectional view of the first covering member 30, the light-absorbing material 31 is concentrated at the bottom surface of the recessed portion 15.

The first covering member 30 includes the containing layer 30a containing the light-absorbing material 31 and the light-transmissive layer 30b in this order from the bottom surface of the recessed portion 15. The containing layer 30a is formed by sedimenting the light-absorbing material 31 and is an area containing a high concentration of the light-absorbing material 31 in the depth direction of the first covering member 30. The light-transmissive layer 30b is mainly made of a resin formed by sedimenting the light-absorbing material 31. In other words, there is no clear interface between the containing layer 30a and the light-transmissive layer 30b.

The first covering member 30 is disposed such that at least a portion of the lateral surfaces of the light-emitting element 20 does not face the containing layer 30a. However, to further enhance the above effect, the area of the lateral surfaces of the light-emitting element 20 facing the containing layer 30a, in other words, in contact with the containing layer 30a, is preferably small. It is more preferable that substantially the entire lateral surfaces of the light-emitting element 20 do not face the containing layer 30a (see FIGS. 6 and 7). In other words, it is preferable that substantially the entire lateral surfaces of the light-emitting element 20 be not covered with the containing layer 30a. In this case, only a portion of the lateral surfaces of the light-emitting element 20 at the mounting surface is covered with the containing layer 30a, and the other region of the lateral surfaces is exposed from the containing layer 30a and covered with the light-transmissive layer 30b and the second covering member 40.

The statement that the first covering member 30 is disposed such that at least a portion of the lateral surfaces of the light-emitting element 20 does not face the containing layer 30a means that the first covering member 30 is disposed such that at least a portion of every outer lateral surface of the light-emitting element 20 in the height direction does not face the containing layer 30a.

In this case, the first covering member 30 is disposed such that the lateral surfaces of the semiconductor layer 22 among lateral surfaces of the light-emitting element 20 are not covered with the containing layer 30a.

The structure in which at least a portion of the semiconductor layer 22 on the lateral surfaces of the light-emitting element 20 does not face the containing layer 30a enhances the light extraction efficiency from the lateral surfaces of the light-emitting element 20 and improves the light distribution characteristics in the area beside the light-emitting element 20.

The thickness of the first covering member 30 is preferably, for example, in a range of 10 μm to 100 μm. If the thickness of the first covering member 30 is 10 μm or more, the first covering member 30 including the containing layer 30a and the light-transmissive layer 30b is easily formed. If the thickness of the first covering member 30 is 100 μm or less, the effect produced by allowing the thickness of the containing layer 30a described above to be smaller than the thickness of the light-emitting element 20 can be further enhanced.

If the thickness of the first covering member 30 is, for example, in a range of 10 μm to 100 μm, the first covering member 30 can be disposed while inhibiting the first covering member 30 from creeping up the lateral surfaces of the light-emitting element 20 due to surface tension in a step of sedimenting the light-absorbing material 31 using a centrifugal force. If the thickness of the first covering member 30 is equal to or less than the thickness of a bonding member between the light-emitting element 20 and the mounting board 10, the effect produced by disposing the containing layer 30a such that the containing layer 30a does not face the lateral surfaces of the light-emitting element 20 described above can be further enhanced. From the above viewpoint, the light-emitting element 20 may be placed on or above the mounting board 10 with a pedestal, such as a submount, therebetween (see FIGS. 6 and 7). The pedestal can be made of, for example, a semiconductor substrate made of silicon, GaP, or GaAs, a transparent substrate made of glass or sapphire, or an electrically-conductive material such as a metal plate. To increase the area to be covered with the first covering member 30, the pedestal preferably has substantially the same size as the light-emitting element 20 in a plan view. The light-emitting elements 20 may be stacked using a light-emitting element 20 as a pedestal.

The first covering member 30 is preferably formed into a thinner layer to increase the exposed portion of the lateral surfaces of the light-emitting element 20. The thickness of the containing layer 30a in the first covering member 30 is preferably 20% or less, more preferably 10% or less, of the thickness of the first covering member 30.

The smaller the ratio of the thickness of the containing layer 30a to the first covering member 30 is, the higher the concentration of the light-absorbing material 31 in the containing layer 30a can be. Hence, the ratio of the thickness of the containing layer 30a to the first covering member 30 can be reduced by increasing the concentration of the light-absorbing material 31 in the containing layer 30a, thereby increasing the portion of the lateral surfaces of the light-emitting element 20 exposed from the containing layer 30a. Accordingly, the effect of suppressing decrease in the light extraction efficiency caused by disposing the containing layer 30a and the effect of causing the light-emitting device 100 to have a black appearance in the unlit state of the light-emitting device 100 can be both achieved. In view of the above, the concentration of the light-absorbing material 31 in the containing layer 30a is, for example, preferably in a range of about 2.5 mass % to 20.0 mass %.

In the case in which a portion of the lateral surfaces of the light-emitting element 20 faces the containing layer 30a, the thickness of the containing layer 30a is preferably ¼ or less, more preferably ⅙ or less, further preferably ⅛ or less, of the thickness of the lateral surfaces of the light-emitting element 20.

Examples of the resin material used for the first resin include thermosetting resins such as epoxy resins, modified epoxy resins, silicone resins, and modified silicone resins.

The viscosity of the first resin is preferably in a range of 0.3 Pa·s to 15 Pa·s at room temperature (20±5° C.). If the viscosity of the first resin is 0.3 Pa·s or more, the first resin is easily disposed on the bottom surface of the recessed portion 15 by potting. If the viscosity of the first resin is 15 Pa·s or less, the first covering member 30 is easily deformed using a centrifugal force. In addition, sedimentation of the light-absorbing material 31 using the centrifugal force is facilitated. The viscosity of the first resin is more preferably 0.5 Pa·s to 6 Pa·s to produce the above effects.

The viscosity of the first resin here is the viscosity when the light-absorbing material 31 is contained; in other words, the viscosity before the light-absorbing material 31 contained in the first resin is sedimented using the centrifugal force as described later.

The light-absorbing material 31 is a substance having a high absorptance for extraneous light, such as a substance that absorbs 90% or more of visible light.

Examples of the material used as the light-absorbing material 31 include carbon black, pigments, and dyes.

A substance having a higher specific gravity than the resin material used for the first resin is preferably used as the light-absorbing material 31. The difference in specific gravity between the light-absorbing material 31 and the resin material facilitates sedimentation of the light-absorbing material 31 toward the bottom surface using a centrifugal force. In addition, employing a light-absorbing material 31 with a large particle diameter allows the light-absorbing material 31 to be sedimented more quickly toward the bottom surface.

Use of the centrifugal force allows the light-absorbing material 31 to be densely disposed and reduces the distances between particles, thereby enhancing the effect of causing the light-emitting device 100 to have a black appearance in the unlit state of the light-emitting device 100.

For example, in the case in which carbon black is used as the light-absorbing material 31, the particle diameter of the light-absorbing material 31 is preferably 0.5 µm to 2.0 depending on the difference in specific gravity between the light-absorbing material 31 and the first resin to be used. Increasing the particle diameter of the light-absorbing material 31 facilitates sedimentation of the light-absorbing material 31 using the centrifugal force. Reducing the particle diameter of the light-absorbing material 31 reduces the distances between the particles to be sedimented and therefore suppresses transmission of light onto the bottom surface of the recessed portion 15 even in the case of a thin containing layer 30a. The particle diameter of carbon black is more preferably 0.8 µm to 1.3 µm in view of the above.

The second covering member 40 is made of a second resin. The second covering member 40 is disposed over the first covering member 30 and the light-emitting elements 20.

Examples of the resin material used for the second resin include thermosetting resins such as epoxy resins, modified epoxy resins, silicone resins, and modified silicone resins. The resin material used for the second resin may be the same as or different from the resin material for the first resin. It is also possible to use a resin having high resistance to heat for the first resin and to use a hard resin for the second resin.

The first resin is preferably softer than the second resin. As the first resin is disposed near the areas in which the light-emitting elements 20 are bonded to the mounting board 10, it is preferable to employ a material that is unlikely to expand with heat and is flexible with heat so as to inhibit excessive stress from being caused by thermal expansion. Use of a soft resin for the first resin can suppress removal of the first resin from the wiring portions (metal members such as leads).

A silicone resin is generally more resistant to light in about 450 nm to 500 nm than an epoxy resin, and an epoxy resin is harder than a silicone resin. Hence, a silicone resin may be used for the first resin, and an epoxy resin may be used for the second resin.

The second resin may contain a phosphor, a diffusing material, a filler, and the like depending on the purpose.

A substance known in the field of the invention can be used as the phosphor. For example, a yellow phosphor such as YAG ($Y_3Al_5O_{12}$:Ce) and silicates, a red phosphor such as CASN ($CaAlSiN_3$:Eu) and KSF ($K_2SiF_6$:Mn), or a green phosphor such as chlorosilicates and $BaSiO_4$:$Eu^{2+}$ can be used.

A substance known in the field of the invention can be used as the diffusing material. For example, barium titanate, titanium oxide, aluminum oxide, or silicon oxide can be used.

[Method for Manufacturing Light-Emitting Device 100]

Subsequently, an example of a method for manufacturing the light-emitting device according to the embodiment will be described.

Figure 3A:
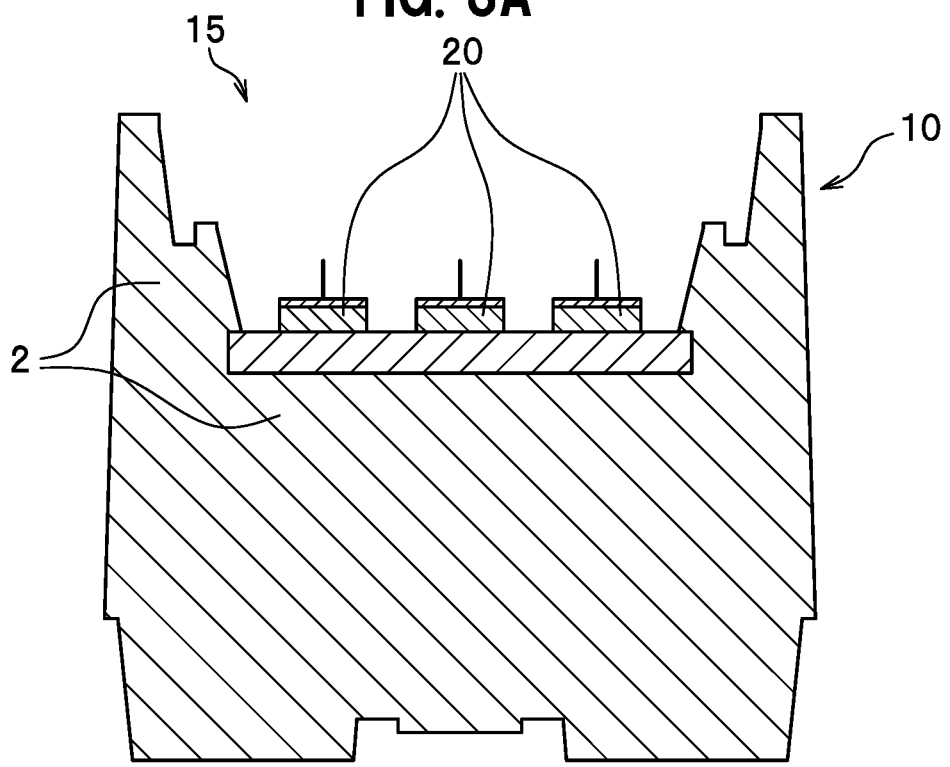
FIG. 3A is a schematic sectional view illustrating a step of placing light-emitting elements in the method for manufacturing the light-emitting device according to the embodiment.
Figure 3B:
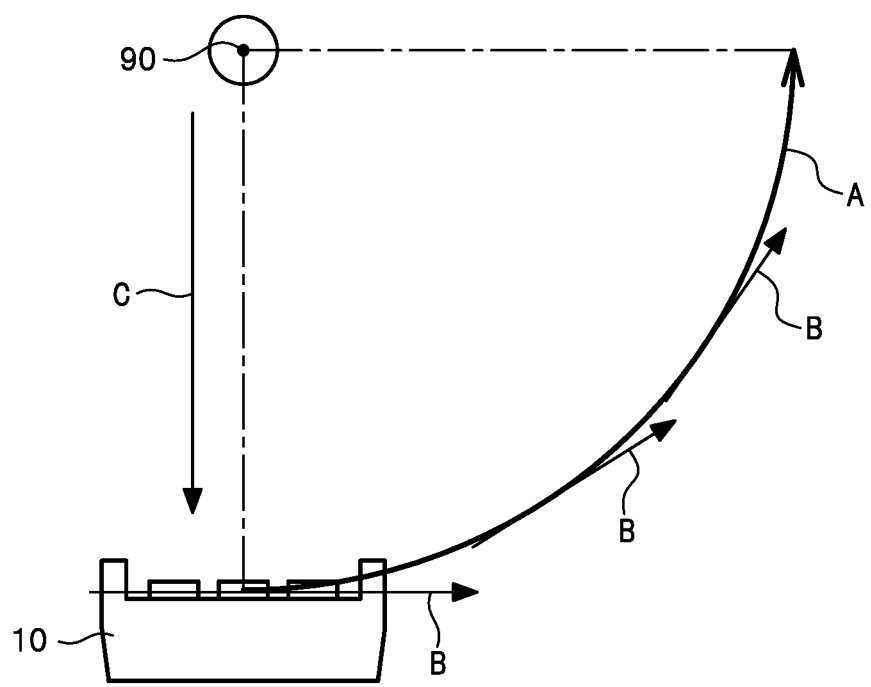
FIG. 3B is a schematic diagram showing a step of covering the upper surface of a mounting board with a first resin and sedimenting a light-absorbing material using a centrifugal force in a step of forming a first covering member in the method for manufacturing the light-emitting device according to the embodiment.
Figure 3C:
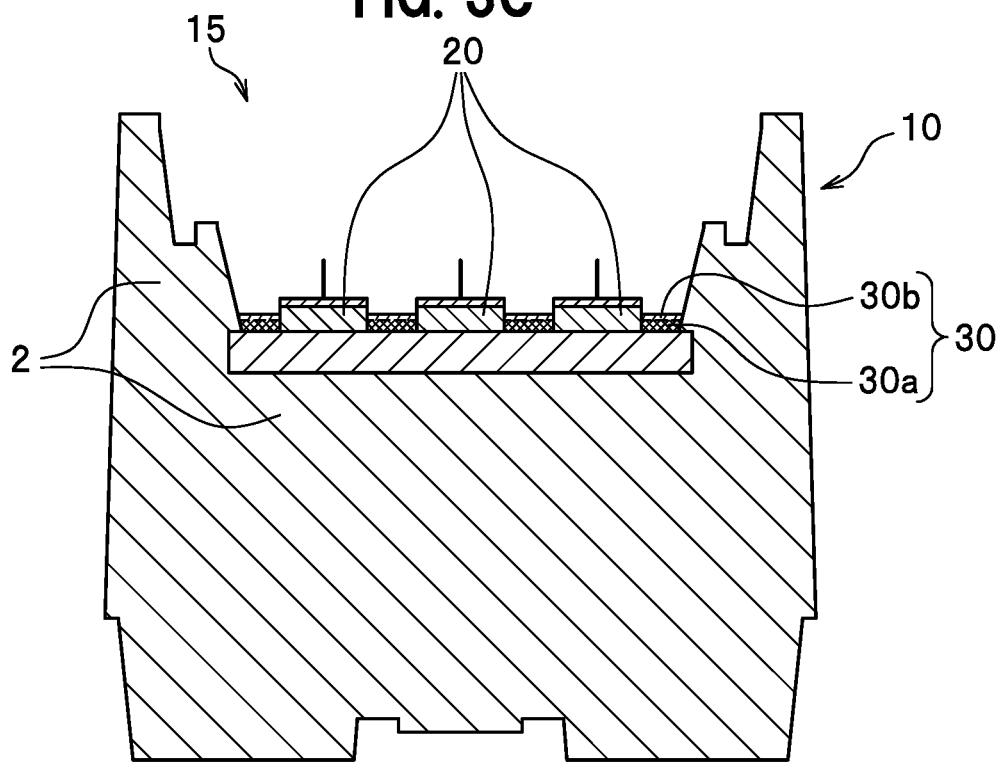
FIG. 3C is a schematic sectional view after the light-absorbing material has been sedimented using the centrifugal force in the step of forming a first covering member in the method for manufacturing the light-emitting device according to the embodiment.
Figure 3D:
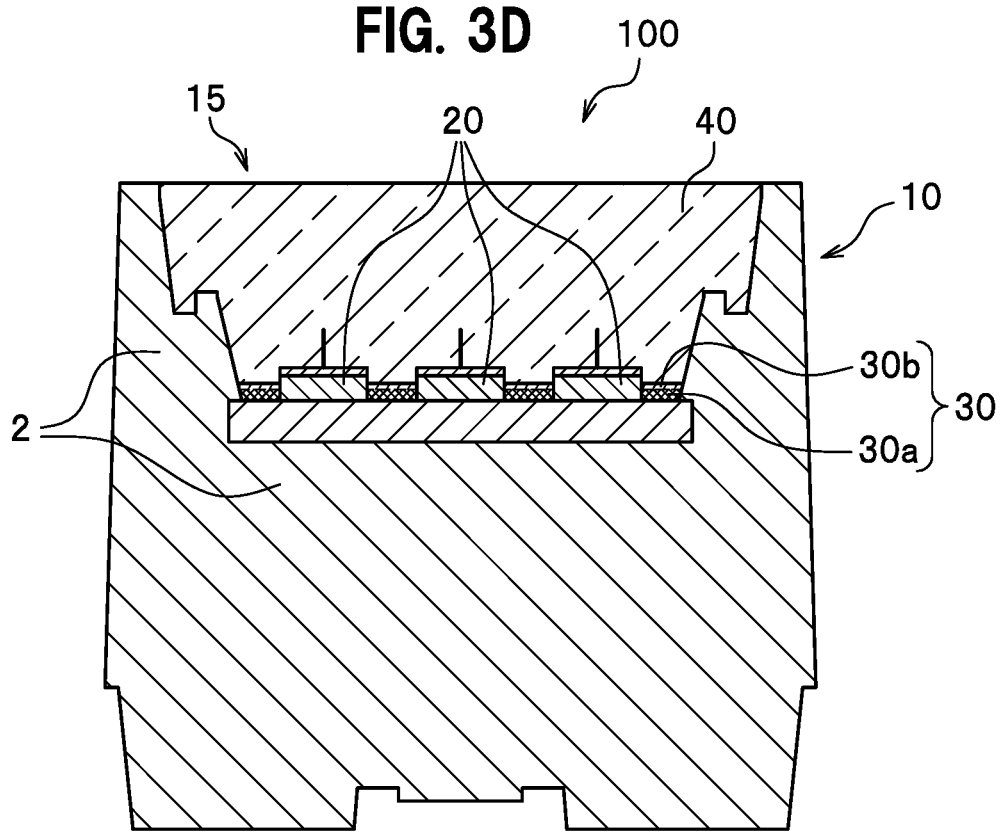
FIG. 3D is a schematic sectional view illustrating a step of forming a second covering member in the method for manufacturing the light-emitting device according to the embodiment.

FIG. 2 is a flowchart illustrating the method for manufacturing the light-emitting device according to the embodiment. FIG. 3A is a schematic sectional view illustrating a step of placing light-emitting elements in the method for manufacturing the light-emitting device according to the embodiment. FIG. 3B is a schematic diagram showing a step of covering the upper surface of the mounting board with the first resin and sedimenting the light-absorbing material using the centrifugal force in a step of forming a first covering member in the method for manufacturing the light-emitting device according to the embodiment. FIG. 3C is a schematic sectional view after the light-absorbing material has been sedimented using the centrifugal force in the step of forming a first covering member in the method for manufacturing the light-emitting device according to the embodiment. FIG. 3D is a schematic sectional view illustrating a step of forming a second covering member in the method for manufacturing the light-emitting device according to the embodiment.

The method for manufacturing the light-emitting device 100 includes a step S101 of placing light-emitting elements, a step S102 of providing a first resin, a step S103 of forming a first covering member, and a step S104 of forming a second covering member. The material and arrangement of each member are as described for the light-emitting device 100, and their descriptions are omitted as appropriate.

(Step of Placing Light-Emitting Elements)

In the step S101 of placing light-emitting elements, the light-emitting elements 20 are placed on or above the mounting board 10.

In the step S101, the light-emitting elements 20 are placed on or above the bottom surface of the recessed portion 15 of the mounting board 10 having the recessed portion 15. The light-emitting elements 20 are face-up mounted on or above the bottom surface of the recessed portion 15 using a non-conductive adhesive material such that the surfaces provided with the electrodes serve as the main light extracting surfaces and such that the surfaces opposite to the surfaces provided with the electrodes serve as the mounting surfaces. Examples of the non-conductive adhesive material include adhesive materials such as epoxy resins and silicone resins. The light-emitting elements 20 may be flip-chip mounted. In this case, an electrically-conductive adhesive material is used. Examples of the electrically-conductive adhesive material include eutectic solder, electrically-conductive paste, and bumps.

(Step of Providing First Resin)

In the step S102 of providing a first resin, a base component of a two-part curable resin material is mixed with the light-absorbing material 31, and a hardener is mixed after at least a certain period of time has passed.

Use of the first resin produced as described above enhances the compatibility between the light-absorbing material 31 and the resin material and facilitates sedimentation of the light-absorbing material 31 using the centrifugal force. The temperature before the hardener is mixed is about equal to room temperature.

Examples of the two-part curable resin material include silicone resins, modified silicone resins, epoxy resins, and modified epoxy resins.

The period of time after the base component of the two-part curable resin material is mixed with the light-absorbing material 31 is preferably two hours or more to facilitate sedimentation of the light-absorbing material 31. The period of time is preferably eight hours or less to reduce production time. After the hardener is mixed, the subsequent step is started before the first resin is cured.

The concentration of the light-absorbing material 31 in the uncured first resin is, for example, about 0.5 mass % to 2.0 mass %.

(Step of Forming First Covering Member)

In the step S103 of forming a first covering member, the first covering member 30 is formed by covering the bottom surface of the recessed portion 15 with the first resin containing the light-absorbing material 31.

In the step S103, for example, the uncured first resin is disposed on the bottom surface of the recessed portion 15 by potting. At this time, the first resin is disposed between the lateral surfaces of the recessed portion 15 and the light-emitting elements 20 on the bottom surface of the recessed portion 15. The first resin is preferably disposed in contact with the inner lateral surfaces of the recessed portion 15. This structure inhibits the first resin from flowing toward the light-emitting elements 20 and therefore inhibits the first resin from creeping up the lateral surfaces of the light-emitting elements 20 before centrifugal rotation. Creeping up of the first resin on the lateral surfaces of the light-emitting elements 20 is inhibited by deformation of the first resin by centrifugal rotation, but the first resin may remain on the lateral surfaces of the light-emitting elements 20 depending on the viscosity of the first resin and the speed of centrifugal rotation. Hence, the first resin before centrifugal rotation preferably does not cover the lateral surfaces of the light-emitting elements 20.

Subsequently, the mounting board 10 is subjected to centrifugal rotation in such a direction that the centrifugal force is applied to the bottom surface of the recessed portion 15. By this operation, the first resin moves toward the bottom surface of the recessed portion 15 to cover the bottom surface of the recessed portion 15. At this time, the centrifugal force inhibits the first resin from wet-spreading on the lateral surfaces of the light-emitting elements 20 in the height direction even in the case in which the first resin covers a portion of the lateral surfaces of the light-emitting elements 20. By forcibly sedimenting the light-absorbing material 31 in the first resin toward the bottom surface of the recessed portion 15 using the centrifugal force, the containing layer 30a in which the light-absorbing material 31 is densely disposed as a sediment layer of the light-absorbing material 31 is formed as well as the light-transmissive layer 30b as the supernatant fluid. By forming the containing layer 30a by centrifugal sedimentation as described above, the particles of the light-absorbing material 31 can be densely disposed at the bottom surface while reducing the content of the light-absorbing material 31 in the first resin. This structure suppresses reflection of extraneous light in the unlit state to provide the light-emitting device 100 that looks blackish outwardly.

The rotation of the mounting board 10 is preferably performed by applying the centrifugal force to the mounting board 10 about such a rotation axis 90 that the upper surface, that is, the bottom surface of the recessed portion 15, of the mounting board 10 is located outside relative to a top of the recessed portion. Specifically, the mounting board 10 is moved in a direction A that revolves around the rotation axis 90 located at the upper surface of the mounting board 10. A direction B in FIG. 3B is parallel to the bottom surface of the recessed portion 15. In FIG. 3B, three examples of the direction B are shown along with the movement of the mounting board 10, but only one mounting board 10 and one example of a direction C described later are shown.

The rotation axis 90 is located on the perpendicular line passing through a substantial center of the bottom surface of the recessed portion 15, is parallel to the bottom surface of the recessed portion 15, and is located at the opening of the recessed portion 15 of the mounting board 10. Accordingly, the centrifugal force is applied in the direction toward the bottom surface of the recessed portion 15 to reduce the spread of the first resin in the height direction of the mounting board 10 and to forcibly sediment the light-absorbing material 31 contained in the first resin toward the bottom surface (in the direction of an arrow C in FIG. 3B) of the recessed portion 15. The first resin is cured in this state, so that the containing layer 30a containing the light-absorbing material 31 and the light-transmissive layer 30b are formed in this order on the bottom surface of the recessed portion 15.

The amount of the first resin to be applied and the content of the light-absorbing material 31 in the first resin are appropriately adjusted. The first covering member 30 is formed such that at least a portion of the lateral surfaces of the light-emitting elements 20 is exposed from the containing layer 30a.

The speed of rotation and the number of revolutions in the centrifugal rotation of the mounting board 10 depend on the content and particle diameter of the light-absorbing material 31, and the number of revolutions and the radius of gyration may be adjusted such that, for example, a centrifugal force of 200×g or more is applied.

When mounting boards 10 are subjected to centrifugal rotation in the state of undivided mounting board before being singulated in the manufacturing process, if the undivided mounting board is a flat plate, the larger the plane area of the undivided mounting board is (more specifically, the greater the length of the mounting board in the direction A of rotation is), the larger the deviations of mounting boards 10 located away from the center of the undivided mounting board from the rotation axis 90 are. For example, if the deviation from the circumference of the circle of revolution toward the direction B in the undivided mounting board is large, the surface of the first resin is inclined relative to the bottom surface of the recessed portion 15, and the state of the surface of the first resin may vary in the undivided mounting board. The deviation can be reduced by increasing the radius of gyration. Specifically, the deviation can be reduced by employing a radius of gyration that is 70 times or more as large as the length of the undivided mounting board disposed in the direction of rotation.

The above deviations are unlikely to be caused in the case in which flexible resin mounting boards 10 that are bent by the centrifugal force along the circumference of the circle whose radius serves as the radius of gyration is used as the undivided mounting board, and the undivided mounting board to be subjected to centrifugal rotation can be larger than the undivided mounting board including non-flexible mounting boards 10. The number of mounting boards to be treated at a time can be thus increased. Examples of the flexible undivided mounting board include resin packages connected by leads.

In the step S103, the first resin is preferably cured while performing sedimentation of the light-absorbing material 31, that is, while under the centrifugal force. The light-absorbing material 31 preferably has a small particle diameter, but the smaller the particle diameter is, the more difficult the sedimentation becomes. Hence, the light-absorbing material 31 is forcibly sedimented using the centrifugal force toward the bottom surface of the recessed portion 15 in this step. In order to perform curing while performing sedimentation of light-absorbing material 31, curing the first resin is preferably performed while maintaining the rotation, in other words, under rotation, in this step.

It is possible to perform curing after stopping the rotation, but without the rotation, the resin is likely to spread over the lateral surfaces of the light-emitting elements 20 due to wettability. Hence, curing the first resin under rotation of the mounting board 10 can inhibit the first resin from creeping up the lateral surfaces of the light-emitting elements 20. Exposing the lateral surfaces of the light-emitting elements 20 from the first resin can further enhance the light extraction efficiency and further improve the light distribution characteristics of the light-emitting device 100.

The temperature during the curing of the first resin is, for example, 40° C. to 200° C. Increasing the temperature during the curing reduces the curing time of the first resin and enhances efficiency. The temperature during the curing is preferably as low as possible in consideration of shifting of the rotation axis 90 due to thermal expansion of metal in a centrifuge. In other words, the temperature during the curing of the first resin is preferably 50° C. or higher in view of efficiency. The temperature during the curing of the first resin is preferably 60° C. or lower in consideration of shifting of the rotation axis 90. In the case in which the curing is performed at 80° C. or higher, the centrifuge is preferably controlled so that the temperature of at least metal parts of the centrifuge will not be 80° C. or higher.

A resin material that can be at least semi-cured by keeping the temperature of the rotating mounting board 10 at 40° C. or higher is preferably selected as the resin material constituting the first resin.

The first resin can be cured while sedimenting the light-absorbing material 31, for example, using hot blown air or a panel heater.

(Step of Forming Second Covering Member)

In the step S104 of forming a second covering member, the second covering member 40 is formed by covering the first covering member 30 and the light-emitting elements 20 with the second resin.

In the step S104, the second resin is disposed in the recessed portion 15 by, for example, potting or spraying. After that, for example, the second resin is cured at a temperature of 120° C. to 200° C. to form the second covering member 40.

The light-emitting device and the method for manufacturing the light-emitting device according to the present embodiment have been specifically described through detailed description of embodiments, but the scope of the present invention is not limited by these descriptions but should be broadly interpreted on the basis of the claims. The scope of the present invention also encompasses various modifications based on these descriptions.

Other Embodiments

Figure 5:
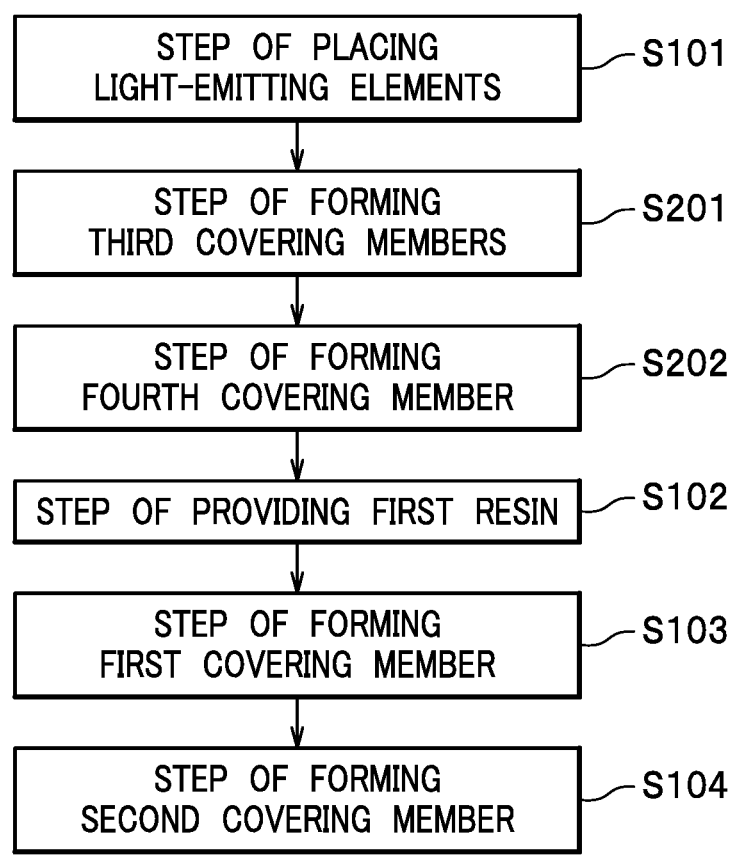
FIG. 5 is a flowchart illustrating a method for manufacturing the light-emitting device according to the other embodiment.
Figure 6:
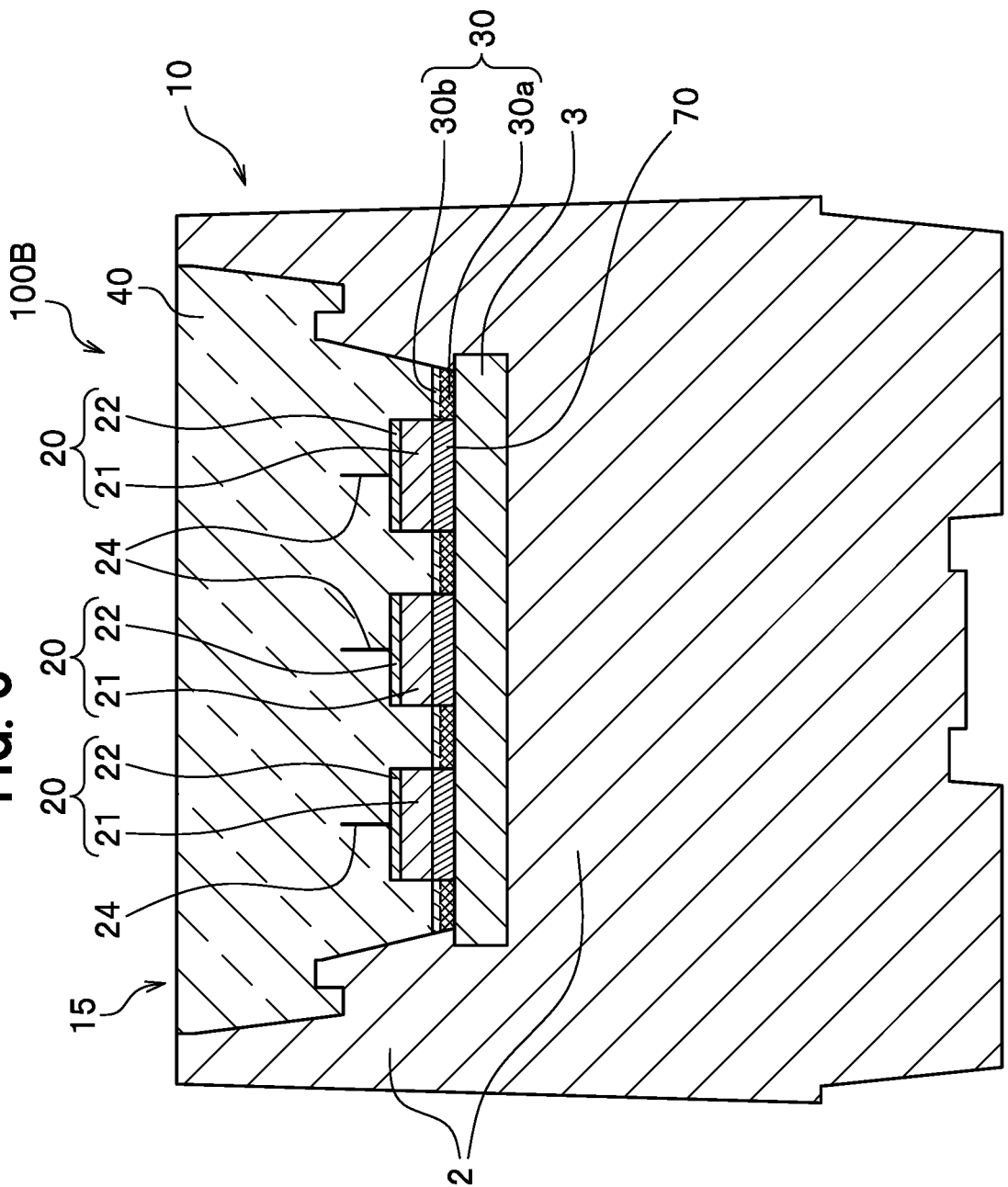
FIG. 6 is a schematic sectional view illustrating the structure of a light-emitting device according to still another embodiment.
Figure 7:
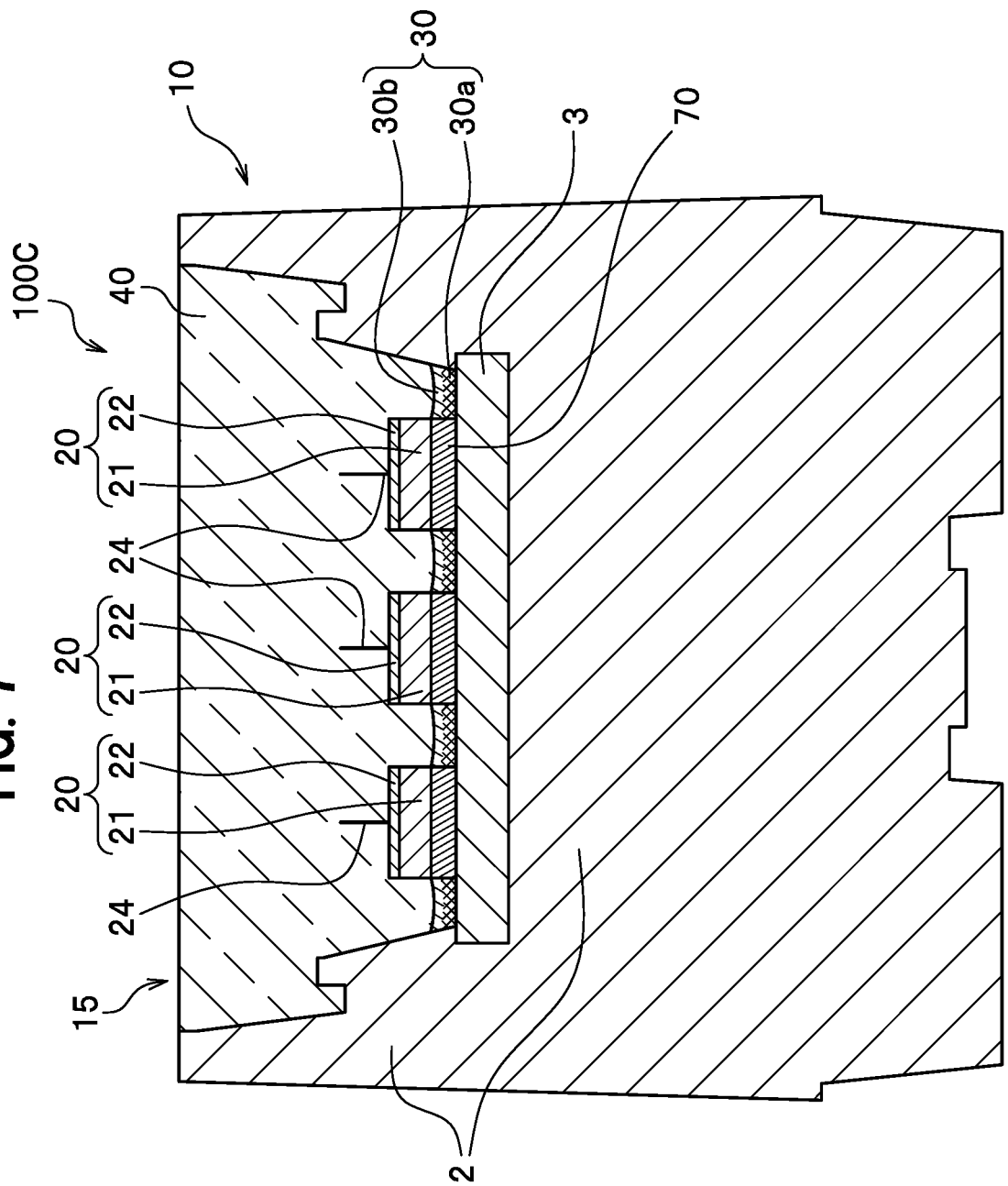
FIG. 7 is a schematic sectional view illustrating the structure of a light-emitting device according to still another embodiment.

FIG. 4 is a schematic sectional view illustrating the structure of a light-emitting device according to another embodiment. FIG. 5 is a flowchart illustrating a method for manufacturing the light-emitting device according to the other embodiment. FIG. 6 is a schematic sectional view illustrating the structure of a light-emitting device according to still another embodiment. FIG. 7 is a schematic sectional view illustrating the structure of a light-emitting device according to still another embodiment.

A light-emitting device 100A shown in FIG. 4 further includes third covering members 50 that contain a reflective material and cover the lateral surfaces of the light-emitting elements 20. The light-emitting device 100A also includes a fourth covering member 60 that contains a reflective material and covers lateral surfaces 11 of the recessed portion 15 of the mounting board 10.

The third covering members 50 are made of a third resin containing the reflective material and cover the lateral surfaces of the light-emitting elements 20.

This structure can enhance the reflectance of light on the lateral surfaces of the light-emitting elements 20 and reduce absorption of light by the first covering member 30 when the light-emitting device 100A emits light.

The third covering members 50 may cover a portion of the lateral surfaces of the light-emitting elements 20 but preferably covers substantially the entire lateral surfaces of the light-emitting elements 20 to enhance the above effects.

In the third covering members 50, the reflective material is dispersed in the third resin. The statement that the reflective material is dispersed in the third resin means that the reflective material is dispersed to such a degree that the function as a reflective layer is provided. For example, the state of dispersion created by applying a resin containing a reflective material by a conventionally known method is sufficient. The reflective material may be partially concentrated as long as the third covering members 50 have the function as reflective layers.

The concentration of the reflective material in the third covering members 50 is, for example, in a range of 10 mass % to 50 mass %.

Examples of the resin material used for the third resin include thermosetting resins such as epoxy resins, modified epoxy resins, silicone resins, and modified silicone resins.

Examples of the light-reflective material used as the reflective material include titanium oxide, silica, silicon oxide, aluminum oxide, zirconium oxide, magnesium oxide, potassium titanate, zinc oxide, and boron nitride. Among these materials, titanium oxide, which has a comparatively high refractive index, is preferably used in view of reflection of light.

The third covering members 50 are formed in a step S201 of forming third covering members by covering the lateral surfaces of the light-emitting elements 20 with the third resin containing the reflective material before the step S103 of forming a first covering member. In this example, the step S201 of forming third covering members is performed after the step S101 of placing light-emitting elements and before a step S202 of forming a fourth covering member.

In the step S201, the third resin intended to cover the lateral surfaces of the light-emitting elements 20 is disposed by, for example, potting. The third resin can be disposed on the lateral surfaces of the light-emitting elements 20 by discharging the uncured resin material from a nozzle of a tip of a resin discharging device filled with the third resin onto the vicinities of the lateral surfaces of the light-emitting elements 20 on the bottom surface of the recessed portion 15 (preferably onto the boundaries between the bottom surface and the lateral surfaces of the light-emitting elements 20). The uncured third resin wet-spreads over the lateral surfaces of the light-emitting elements 20 and covers the lateral surfaces of the light-emitting elements 20. At this time, the third resin also flows onto the bottom surface of the recessed portion 15 and covers a portion of the bottom surface of the recessed portion 15. The viscosity and positions of the third resin to be formed are preferably adjusted such that the third resin creeps up to the upper portions of the lateral surfaces of the light-emitting elements 20. In the case in which the third covering members 50 are formed by potting, the viscosity of the third resin is adjusted to, for example, 1 Pa·s to 50 Pa·s at room temperature (20±5° C.).

The uncured third resin contains the reflective material, and the concentration of the reflective material in the third resin is preferably 10 mass % to 50 mass %.

The third resin is disposed near the lateral surfaces of the light-emitting elements 20 on the bottom surface of the recessed portion 15 by potting, so that the third resin wet-spreads over the lateral surfaces of the light-emitting elements 20. At this time, the reflective material is dispersed in the third resin in the third covering members 50.

After that, for example, the third resin is cured at a temperature of 120° C. to 200° C. to form the third covering members 50. It is preferable that the third resin be cured with the mounting board 10 motionless after the third resin has wet-spread over the lateral surfaces of the light-emitting elements 20.

The fourth covering member 60 is made of a fourth resin containing a reflective material and covers the lateral surfaces 11 of the recessed portion 15 of the mounting board 10.

This structure inhibits the lateral surfaces 11 of the recessed portion 15 from transmitting or absorbing light.

The fourth covering member 60 is spaced apart from the lateral surfaces of the light-emitting elements 20 and covers the outer edges of the bottom surface of the recessed portion 15. The fourth covering member 60 covers the outer edges of the bottom surface of the recessed portion 15 and the lateral surfaces 11 of the recessed portion 15 and has steps. The lateral surfaces 11 of the recessed portion 15 has steps, and the fourth covering member 60 covers first lateral surfaces 11$a$ and second lateral surfaces 11$b$ of the recessed portion 15. The fourth covering member 60 more preferably covers substantially the entire lateral surfaces 11 of the recessed portion 15 and preferably covers the lateral surfaces 11 of the recessed portion 15 at least such that the reflective material are located above the upper surfaces of the light-emitting elements 20 in a sectional view of the light-emitting device 100. The fourth covering member 60 is formed so as to have two levels on each lateral surface of the recessed portion 15 in this example, but the fourth covering member 60 may be formed continuously from the outer edges of the bottom surface of the recessed portion 15 to the lateral surfaces 11 of the recessed portion 15, depending on the shape of the mounting board 10.

In the fourth covering member 60, the reflective material is dispersed in the fourth resin. The statement that the reflective material is dispersed in the fourth resin means that the reflective material is dispersed to such a degree that the function as a reflective layer is provided. For example, the state of dispersion created by applying a resin containing a reflective material by a conventionally known method is sufficient. The reflective material may be partially concentrated as long as the fourth covering member 60 has the function as a reflective layer.

The concentration of the reflective material in the fourth covering member 60 is, for example, 10 mass % to 50 mass %.

The resin material and the light-reflective material used for the third resin can be used as the resin material and the reflective material used for the fourth resin.

The fourth covering member 60 is formed in the step S202 of forming a fourth covering member by covering the lateral surfaces 11 of the recessed portion 15 with the fourth resin containing the reflective material before the step S103 of forming a first covering member. In this example, the step S202 of forming a fourth covering member is performed after the step S201 of forming third covering members and before the step S102 of providing a first resin.

In the step S202, the fourth resin intended to cover the lateral surfaces 11 of the recessed portion 15 is disposed by, for example, potting. The fourth resin can be disposed in the recessed portion 15 by discharging the uncured resin material from a nozzle of a tip of a resin discharging device filled with the fourth resin onto the vicinities of the outer edges of the bottom surface of the recessed portion 15 (preferably onto the boundaries between the bottom surface and the first lateral surfaces 11a). The uncured fourth resin wet-spreads over the first lateral surfaces 11a of the recessed portion 15 and covers the first lateral surfaces 11a of the recessed portion 15. At this time, the fourth resin also flows onto the bottom surface of the recessed portion 15 and covers a portion of the outer edges of the bottom surface of the recessed portion 15. The viscosity and positions of the fourth resin to be formed are preferably adjusted such that the fourth resin is spaced apart from the lateral surfaces of the light-emitting elements 20 and creeps up to the upper portions of the first lateral surfaces 11a of the recessed portion 15.

Similarly, the fourth resin can be disposed in the recessed portion 15 by discharging the uncured resin material from a nozzle of a tip of a resin discharging device filled with the fourth resin onto the bottom surfaces of lateral recessed portions 16 located at the steps of the lateral surfaces 11 of the recessed portion 15. The uncured fourth resin spreads over the second lateral surfaces 11b of the recessed portion 15 and covers the second lateral surfaces 11b of the recessed portion 15. At this time, the fourth resin also flows onto the bottom surfaces and the lateral surfaces of the lateral recessed portions 16 and the upper surfaces of lateral projections 17 located at the steps of the recessed portion 15 and covers the bottom surfaces and the lateral surfaces of the lateral recessed portions 16 and the upper surfaces of the lateral projections 17. The viscosity and positions of the fourth resin to be formed are preferably adjusted such that the fourth resin creeps up to the upper portions of the second lateral surfaces 11b of the recessed portion 15.

In the case in which the fourth covering member 60 is formed by potting, the viscosity of the fourth resin is adjusted to be, for example, in a range of 1 Pa·s to 50 Pa·s at room temperature (20±5° C.).

In the step S202, the inner surfaces of the recessed portion 15 can be preliminarily immersed in an organic solvent. Preliminarily immersing the inner surfaces of the recessed portion 15 in the organic solvent encourages the fourth resin to creep up the lateral surfaces 11 of the recessed portion 15. Employing a material having high wettability for the lateral surfaces 11 of the recessed portion 15 and roughening the lateral surfaces 11 can also encourage the fourth resin to creep up the lateral surfaces 11 of the recessed portion 15.

The uncured fourth resin contains the reflective material, and the concentration of the reflective material in the fourth resin is preferably 10 mass % to 50 mass %.

The fourth resin is disposed near the outer edges of the bottom surface of the recessed portion 15 by potting, so that the fourth resin wet-spreads over the first lateral surfaces 11a of the recessed portion 15. Also, the fourth resin is disposed on the bottom surfaces of the lateral recessed portions 16 by potting, so that the fourth resin wet-spreads over the second lateral surfaces 11b of the recessed portion 15. At this time, the reflective material is dispersed in the fourth resin in the fourth covering member 60.

After that, for example, the fourth resin is cured at a temperature of 120° C. to 200° C. to form the fourth covering member 60. It is preferable that the fourth resin be cured with the mounting board 10 motionless after the fourth resin has wet-spread over the lateral surfaces 11 of the recessed portion 15.

A light-emitting device 100B shown in FIG. 6 includes pedestals 70 between the light-emitting elements 20 and the bottom surface of the recessed portion 15. With this structure, the light-emitting elements 20 are raised in the height direction of the light-emitting elements 20. Accordingly, the first covering member 30 can be disposed such that the lateral surfaces of the light-emitting elements 20 do not face the containing layer 30a containing the light-absorbing material 31.

This structure reduces losses of primary light due to reflection from the lateral surfaces of the light-emitting elements 20. The light distribution characteristics of the light-emitting device 100B can be further improved because of increase in the primary light to be extracted from the lateral surfaces of the light-emitting elements 20.

In a light-emitting device 100C shown in FIG. 7, the surface of the first covering member 30 is recessed with respect to the opening of the recessed portion 15. Such a state of the surface can be achieved by reducing the speed of rotation of the mounting board 10. In the first covering member 30, the light-transmissive layer 30b may not be substantially formed. That is, the thickness of the containing layer 30a in the first covering member 30 may be equal to the thickness of the first covering member 30. Also in this case, the first resin can be deformed by curing the first resin under rotation, that is, while applying the centrifugal force, to cover the entire upper surface of the mounting board 10 exposed from the first covering member 30, that is, the entire bottom surface of the recessed portion 15, while inhibiting the first covering member 30 from creeping up the lateral surfaces of the light-emitting elements 20.

At this time, by disposing the pedestals 70 between the light-emitting elements 20 and the bottom surface of the recessed portion 15, the first covering member 30 can be disposed such that the lateral surfaces of the light-emitting elements 20 do not face the first covering member 30 containing the light-absorbing material 31.

This structure reduces losses of primary light due to reflection from the lateral surfaces of the light-emitting elements 20. The light distribution characteristics of the light-emitting device 100C can be further improved because of increase in the primary light to be extracted from the lateral surfaces of the light-emitting elements 20.

In the light-emitting devices described above, the light-emitting elements are face-up mounted, but the light-emitting elements may be flip-chip mounted. In the case in which the light-emitting elements are flip-chip mounted, the light-emitting elements are preferably raised in the height direction of the light-emitting elements using submounts, bumps, or post electrodes as the pedestals described above. In the case in which the light-emitting elements are flip-chip mounted, each semiconductor layer is disposed facing the bottom surface of the recessed portion of the mounting board (the mounting board of the light-emitting device). Raising the light-emitting elements in the height direction of the light-emitting elements inhibits the containing layer from covering a portion of the lateral surfaces or the entire lateral surfaces of the semiconductor layers.

The light-emitting devices described above each include the mounting board having the recessed portion, and the light-emitting elements are placed on or above the bottom surface of the recessed portion. However, the light-emitting device may include a flat mounting board on or above which the light-emitting elements are placed.

The method for manufacturing the light-emitting device may include another step between the steps or before or after the steps, as long as the additional step does not adversely affect the other steps. For example, a foreign matter removal step of removing foreign matters mixed during manufacture may be included.

In the method for manufacturing the light-emitting device, the order of some steps is not limited but may be changed. For example, the method for manufacturing the light-emitting device described above includes the step of providing a first resin after the step of placing light-emitting elements, but the step of providing a first resin may be performed before the step of placing light-emitting elements. The step of providing a first resin may be omitted.

The step of forming third covering members is performed after the step of placing light-emitting elements and before the step of forming a fourth covering member in the above embodiment but may be performed after the step of forming a fourth covering member and before the step of providing a first resin or may be performed after the step of providing a first resin and before the step of forming a first covering member.

The step of forming a fourth covering member is performed after the step of forming third covering members and before the step of providing a first resin in the above embodiment but may be performed after the step of placing light-emitting elements and before the step of forming third covering members, may be performed after the step of providing a first resin and before the step of forming a first covering member, or may be performed before the step of placing light-emitting elements.

The light-emitting devices according to the embodiments of the present disclosure can be used for light sources for backlights of liquid-crystal displays, a variety of lighting apparatuses, large format displays, and various displays for advertisements or destination guides, as well as digital video cameras, image scanners in apparatuses such as facsimile machines, copying machines, and scanners, projectors, and other apparatuses. The light-emitting devices according to the embodiments of the present disclosure can be particularly suitably used as pixels of a display because the light-emitting devices have a black appearance in the unlit state.

The invention claimed is:

1. A method for manufacturing a light-emitting device, the method comprising:
   placing at least one light-emitting element on or above a mounting board;
   forming a first covering member that covers an upper surface of the mounting board, which comprises sedimenting a light-absorbing material in a first resin by subjecting the mounting board and the first resin to a centrifugal force, and curing the first resin, such that the first covering member comprises, in order from the upper surface of the mounting board:
      a containing layer comprising the light-absorbing material, and
      a light-transmissive layer, and
      wherein at least a portion of a lateral surface of the light-emitting element is exposed from the containing layer; and
   after curing the first resin, forming a second covering member by covering the first covering member and the light-emitting element with a second resin.

2. The method for manufacturing a light-emitting device according to claim 1, wherein, in the step of forming a first covering member, the first resin is cured while subjecting the mounting board and the first resin to the centrifugal force.

3. The method for manufacturing a light-emitting device according to claim 1, wherein a viscosity of the first resin is in a range of 0.3 Pa·s to 15 Pa·s.

4. The method for manufacturing a light-emitting device according to claim 1, wherein the at least one light-emitting element comprises a plurality of light-emitting elements.

5. The method for manufacturing a light-emitting device according to claim 1, wherein, in the step of placing at least one light-emitting element, the light-emitting element is face-up mounted.

6. The method for manufacturing a light-emitting device according to claim 1, further comprising, before the step of forming a first covering member, forming a third covering member by covering the lateral surface of the light-emitting element with a third resin comprising a reflective material.

7. The method for manufacturing a light-emitting device according to claim 1, further comprising, before forming the first covering member, forming the first resin, which comprises mixing a base component of a two-part curable resin material with the light-absorbing material, and, after two hours or more, mixing a hardener into the base component.

8. The method for manufacturing a light-emitting device according to claim 1, wherein a particle diameter of the light-absorbing material is in a range of 0.5 µm to 2.0 µm.

9. The method for manufacturing a light-emitting device according to claim 1, wherein a concentration of the light-absorbing material in the containing layer is in a range of 2.5 mass % to 20.0 mass %.

10. The method for manufacturing a light-emitting device according to claim 1, wherein a concentration of the light-absorbing material in the first resin before curing is in a range of 0.5 mass % to 2.0 mass %.

11. The method for manufacturing a light-emitting device according to claim 1, wherein a thickness of the containing layer is ¼ or less of a thickness of the light-emitting element in a direction of the lateral surfaces of the light-emitting element.

12. The method for manufacturing a light-emitting device according to claim 1, wherein the centrifugal force is 200×g or more.

13. A method for manufacturing a light-emitting device, the method comprising:
   providing a mounting board comprising a recessed portion defined by an upper surface and inner lateral surfaces of the mounting board;
   placing at least one light-emitting element on or above the upper surface of the mounting board;
   forming a first covering member that covers the upper surface of the mounting board, which comprises:
      disposing a first resin comprising a light-absorbing material on the mounting board by potting such that the first resin contacts the inner lateral surfaces of the mounting board but does not contact lateral surfaces of the light-emitting element,
      deforming the first resin to cover an entire upper surface of the mounting board by subjecting the mounting board and the first resin to a centrifugal force, and
      curing the first resin while the first resin is subjected to the centrifugal force; and
   forming a second covering member by covering the first covering member and the light-emitting element with a second resin.

14. The method for manufacturing a light-emitting device according to claim 13, wherein a temperature for curing the first resin is in a range of 40° C. to 200° C.

15. The method for manufacturing a light-emitting device according to claim 13, wherein a particle diameter of the light-absorbing material is in a range of 0.5 µm to 2.0 µm.

* * * * *